US012646956B2

(12) United States Patent
Lee

(10) Patent No.: US 12,646,956 B2
(45) Date of Patent: Jun. 2, 2026

(54) BATTERY BANK POWER CONTROL APPARATUS AND METHOD

(71) Applicant: LG ENERGY SOLUTION, LTD., Seoul (KR)

(72) Inventor: Chung-Yong Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 777 days.

(21) Appl. No.: 18/012,439

(22) PCT Filed: Jan. 12, 2022

(86) PCT No.: PCT/KR2022/000593
§ 371 (c)(1),
(2) Date: Dec. 22, 2022

(87) PCT Pub. No.: WO2022/154498
PCT Pub. Date: Jul. 21, 2022

(65) Prior Publication Data
US 2023/0179005 A1 Jun. 8, 2023

(30) Foreign Application Priority Data

Jan. 13, 2021 (KR) ........................ 10-2021-0004821

(51) Int. Cl.
*H02J 7/62* (2026.01)
*H01M 10/44* (2006.01)
(Continued)

(52) U.S. Cl.
CPC ............. *H02J 7/62* (2026.01); *H01M 10/441* (2013.01); *H02J 7/50* (2026.01); *H02J 7/94* (2026.01);
(Continued)

(58) Field of Classification Search
CPC .. H02J 7/00304; H02J 7/0013; H02J 7/00714; H02J 7/62; H02J 7/50; H02J 7/94; H01M 10/441
(Continued)

(56) References Cited

U.S. PATENT DOCUMENTS 5,606,243 A * 2/1997 Sakai ................. G01R 31/3648
320/152
5,736,831 A * 4/1998 Harrington ............. B60L 53/14
320/148
(Continued)

FOREIGN PATENT DOCUMENTS

JP 2012-070609 A 4/2012
JP 5783129 B2 9/2015
(Continued)

OTHER PUBLICATIONS

The extended European Search Report (EESR) dated Feb. 1, 2024, issued in corresponding EP Patent Application No. 22739693.4.
(Continued)

*Primary Examiner* — John T Trischler
(74) *Attorney, Agent, or Firm* — Morgan, Lewis & Bockius LLP

(57) ABSTRACT

A battery bank power control apparatus controls a power of a battery bank having a plurality of battery racks, and includes a power adjusting unit configured to adjust a magnitude of a bank power amount input to or output from all of the plurality of battery racks based on a preset bank power limit; a power measuring unit configured to measure a rack power amount for each of the plurality of battery racks; and a bank control unit configured to set the bank power limit based on the rack power measurement value of each battery rack measured by the power measuring unit. The battery bank power control apparatus may effectively prevent a specific battery rack from being damaged due to
(Continued)

power imbalance between battery racks in the battery bank including a plurality of battery racks.

16 Claims, 7 Drawing Sheets

(51) Int. Cl.

| | |
|---|---|
| *H02J 7/50* | (2026.01) |
| *H02J 7/94* | (2026.01) |
| *G01R 31/396* | (2019.01) |
| *H01M 10/42* | (2006.01) |
| *H01M 10/48* | (2006.01) |
| *H02J 7/00* | (2006.01) |
| *H02J 7/80* | (2026.01) |
| *H02J 7/90* | (2026.01) |

(52) U.S. Cl.

CPC ....... *B60L 2240/549* (2013.01); *G01R 31/396* (2019.01); *H01M 2010/4271* (2013.01); *H01M 10/482* (2013.01); *H02J 7/80* (2026.01); *H02J 7/855* (2026.01); *H02J 7/933* (2026.01)

(58) Field of Classification Search

USPC .......................................................... 320/134

See application file for complete search history.

(56) References Cited

U.S. PATENT DOCUMENTS

| | | | | |
|---|---|---|---|---|
| 6,294,843 | B1 * | 9/2001 | Kato ......................... | B60L 58/12 |
| | | | | 290/40 C |
| 6,868,318 | B1 * | 3/2005 | Cawthorne ........... | B60W 20/19 |
| | | | | 320/134 |
| 7,196,493 | B2 * | 3/2007 | McGee ................... | B60L 58/15 |
| | | | | 320/132 |
| 7,321,220 | B2 * | 1/2008 | Plett .................... | G01R 31/3648 |
| | | | | 324/426 |
| 7,624,292 | B2 * | 11/2009 | Nishida .............. | G01R 31/3842 |
| | | | | 324/432 |
| 7,656,122 | B2 * | 2/2010 | Plett .................... | G01R 31/3648 |
| | | | | 320/128 |
| 7,683,579 | B2 * | 3/2010 | Kim ................... | H02J 7/00306 |
| | | | | 320/132 |
| 7,880,331 | B2 * | 2/2011 | Bax ......................... | B60L 58/10 |
| | | | | 307/46 |
| 7,944,179 | B2 * | 5/2011 | Labrunie .............. | H02J 7/1415 |
| | | | | 320/150 |
| 7,952,224 | B2 * | 5/2011 | Sawada .............. | B60L 15/2009 |
| | | | | 903/907 |
| 7,969,120 | B2 * | 6/2011 | Plett .................... | G01R 31/3648 |
| | | | | 320/135 |
| 8,112,192 | B2 * | 2/2012 | Heap ...................... | B60K 6/365 |
| | | | | 180/65.21 |
| 8,183,838 | B2 * | 5/2012 | Sun ........................ | H02J 7/0069 |
| | | | | 320/155 |
| 8,643,214 | B2 * | 2/2014 | Yamamoto ........... | B60L 3/0046 |
| | | | | 307/9.1 |
| 8,880,251 | B2 * | 11/2014 | Matsumoto ............. | B60L 58/25 |
| | | | | 903/903 |
| 9,000,712 | B2 * | 4/2015 | Abe .................. | H02J 7/007194 |
| | | | | 320/101 |
| 9,331,511 | B2 * | 5/2016 | Becker ...................... | H02J 3/32 |
| 9,438,061 | B2 * | 9/2016 | Takeyama ........... | H02J 7/00712 |
| 9,550,434 | B2 * | 1/2017 | King ...................... | B60L 58/20 |
| 9,692,233 | B2 * | 6/2017 | Becker .................. | G05B 15/02 |
| 9,825,474 | B2 * | 11/2017 | Tohara .............. | H01M 10/441 |
| 9,855,376 | B2 * | 1/2018 | Bluvshtein ......... | A61M 60/873 |
| 9,935,492 | B2 * | 4/2018 | Smith ................... | B60L 58/20 |
| 10,376,625 | B2 * | 8/2019 | Bluvshtein ............. | H01F 38/14 |
| 10,505,375 | B2 * | 12/2019 | Bryngelsson ........... | H02J 7/005 |
| 10,527,656 | B2 * | 1/2020 | Choi .................... | H01M 10/44 |
| 10,601,249 | B2 * | 3/2020 | Park ................... | H02J 7/00034 |

| | | | | |
|---|---|---|---|---|
| 10,705,585 | B2 * | 7/2020 | Chandra ................... | G06F 1/28 |
| 10,753,977 | B2 * | 8/2020 | Cha ........................ | H01M 10/48 |
| 10,926,661 | B2 * | 2/2021 | Bolger ................... | B60L 58/14 |
| 10,938,211 | B2 * | 3/2021 | Bell ........................ | B60L 55/00 |
| 11,025,063 | B2 * | 6/2021 | Triebel ................. | H02J 7/0013 |
| 11,043,821 | B2 * | 6/2021 | Nishikawa ........... | H02J 7/0013 |
| 11,251,473 | B2 * | 2/2022 | Machida ............. | H01M 10/441 |
| 11,277,013 | B2 * | 3/2022 | Watanabe ........... | H01M 10/482 |
| 11,329,327 | B2 * | 5/2022 | Nishikawa ................ | H02J 7/02 |
| 11,366,169 | B2 * | 6/2022 | Ahn .................. | H01M 10/4264 |
| 11,482,875 | B2 * | 10/2022 | Choi .................... | H01M 10/44 |
| 11,579,204 | B2 * | 2/2023 | Axelsson ............. | G01R 31/387 |
| 11,594,895 | B2 * | 2/2023 | Ino ........................ | H02J 7/0014 |
| 11,646,599 | B2 * | 5/2023 | Ino ........................ | H02J 7/0018 |
| | | | | 320/128 |
| 11,680,988 | B2 * | 6/2023 | Kawakami ......... | G01R 31/3842 |
| | | | | 702/63 |
| 11,735,781 | B2 * | 8/2023 | Sugiyama ........... | H02J 7/00304 |
| | | | | 320/137 |
| 11,862,978 | B2 * | 1/2024 | Watanabe ................. | H02J 7/02 |
| 11,946,977 | B2 * | 4/2024 | Axelsson .............. | H01M 10/48 |
| 11,967,847 | B2 * | 4/2024 | Yoon .................... | H01M 10/482 |
| 12,005,807 | B2 * | 6/2024 | Qiao ................... | H01M 10/4257 |
| 12,051,925 | B2 * | 7/2024 | Watanabe ............. | H02J 7/0013 |
| 12,057,729 | B2 * | 8/2024 | Choi ................. | H02J 7/007182 |
| 12,142,959 | B2 * | 11/2024 | Choi ................. | H02J 7/007182 |
| 12,399,224 | B2 * | 8/2025 | Kawakami ........... | H01M 10/482 |
| 12,438,204 | B2 * | 10/2025 | Furukawa ........... | H01M 10/441 |
| 2005/0110498 | A1 * | 5/2005 | Plett ................... | G01R 31/3828 |
| | | | | 324/433 |
| 2006/0022642 | A1 * | 2/2006 | McGee ................... | B60L 58/15 |
| | | | | 320/132 |
| 2006/0117194 | A1 * | 6/2006 | Nishida .............. | G01R 31/3842 |
| | | | | 713/300 |
| 2006/0284614 | A1 * | 12/2006 | Kim .................... | H02J 7/00712 |
| | | | | 324/149 |
| 2008/0094035 | A1 * | 4/2008 | Plett ................... | G01R 31/3648 |
| | | | | 320/136 |
| 2008/0157593 | A1 * | 7/2008 | Bax ........................ | B60L 50/61 |
| | | | | 307/19 |
| 2008/0278118 | A1 * | 11/2008 | Labrunie .............. | H02J 7/1415 |
| | | | | 320/155 |
| 2009/0118080 | A1 * | 5/2009 | Heap ........................ | B60K 6/26 |
| | | | | 477/3 |
| 2009/0160406 | A1 * | 6/2009 | Sun ........................ | H02J 7/0069 |
| | | | | 320/157 |
| 2010/0096918 | A1 * | 4/2010 | Sawada ................... | B60L 58/22 |
| | | | | 307/9.1 |
| 2010/0174500 | A1 * | 7/2010 | Plett ..................... | G01R 31/367 |
| | | | | 324/427 |
| 2011/0199042 | A1 * | 8/2011 | Abe .......................... | H02J 3/32 |
| | | | | 320/136 |
| 2011/0213524 | A1 * | 9/2011 | Matsumoto ............. | B60L 58/24 |
| | | | | 903/903 |
| 2011/0298626 | A1 * | 12/2011 | Fechalos ............. | H02J 7/00309 |
| | | | | 320/152 |
| 2012/0074894 | A1 | 3/2012 | Chen et al. | |
| 2013/0187450 | A1 * | 7/2013 | Yamamoto .............. | B60L 58/12 |
| | | | | 307/43 |
| 2014/0159666 | A1 | 6/2014 | Takeyama | |
| 2014/0347016 | A1 * | 11/2014 | Becker ...................... | H02J 3/32 |
| | | | | 320/136 |
| 2015/0048778 | A1 | 2/2015 | Davidson | |
| 2016/0013670 | A1 * | 1/2016 | Tohara ................... | H02J 7/0048 |
| | | | | 320/112 |
| 2016/0022891 | A1 * | 1/2016 | Bluvshtein .......... | H02J 7/00304 |
| | | | | 600/16 |
| 2016/0064927 | A1 * | 3/2016 | Smith ..................... | H02J 7/345 |
| | | | | 307/63 |
| 2016/0181838 | A1 | 6/2016 | Bryngelsson et al. | |
| 2016/0185249 | A1 * | 6/2016 | King ........................ | H02P 27/06 |
| | | | | 320/135 |
| 2016/0211668 | A1 * | 7/2016 | Becker ................... | G05B 15/02 |
| 2017/0059662 | A1 * | 3/2017 | Cha ........................ | G01R 31/367 |
| 2017/0077706 | A1 * | 3/2017 | Triebel ................. | H02J 7/0013 |
| 2017/0264144 | A1 * | 9/2017 | Park ........................ | H02J 50/80 |
| 2018/0120361 | A1 * | 5/2018 | Choi ................... | H02J 7/00302 |

(56) References Cited

U.S. PATENT DOCUMENTS

| | | | |
|---|---|---|---|
| 2018/0207338 A1* | 7/2018 | Bluvshtein | A61M 60/178 |
| 2019/0302863 A1* | 10/2019 | Chandra | G06F 1/329 |
| 2020/0086748 A1* | 3/2020 | Bolger | H02J 7/00 |
| 2020/0124681 A1* | 4/2020 | Axelsson | G01R 31/387 |
| 2020/0161859 A1* | 5/2020 | Bell | H02J 3/14 |
| 2020/0161875 A1* | 5/2020 | Nishikawa | H02J 3/32 |
| 2020/0169105 A1 | 5/2020 | Watanabe et al. | |
| 2020/0176829 A1 | 6/2020 | Nishikawa et al. | |
| 2020/0209315 A1 | 7/2020 | Ahn | |
| 2020/0303787 A1* | 9/2020 | Machida | G01R 31/389 |
| 2020/0303929 A1* | 9/2020 | Watanabe | H02J 7/02 |
| 2020/0343758 A1 | 10/2020 | Choi | |
| 2021/0197690 A1* | 7/2021 | Qiao | B60L 58/13 |
| 2021/0226266 A1* | 7/2021 | Sugiyama | H02J 7/00714 |
| 2021/0305838 A1* | 9/2021 | Stellnert | H02J 7/007192 |
| 2021/0389382 A1* | 12/2021 | Kawakami | H01M 10/482 |
| 2022/0029428 A1* | 1/2022 | Ino | H02J 1/102 |
| 2022/0140618 A1 | 5/2022 | Yoon et al. | |
| 2022/0209319 A1* | 6/2022 | Furukawa | H01M 10/425 |
| 2022/0216704 A1* | 7/2022 | Klintberg | H02J 7/0048 |
| 2022/0224125 A1* | 7/2022 | Thorsøe | H02J 7/0048 |
| 2022/0407332 A1* | 12/2022 | Watanabe | H02J 7/00047 |
| 2022/0416562 A1* | 12/2022 | Ino | G01R 19/10 |
| 2023/0049423 A1* | 2/2023 | Choi | H02J 7/0013 |
| 2023/0119821 A1* | 4/2023 | Sharma | H02J 7/0013 |
| | | | 320/124 |
| 2023/0168310 A1* | 6/2023 | Axelsson | G01R 31/389 |
| | | | 429/50 |
| 2023/0198279 A1* | 6/2023 | Choi | G01R 31/3648 |
| | | | 320/134 |
| 2023/0266397 A1* | 8/2023 | Kawakami | G01R 31/3828 |
| | | | 702/63 |
| 2023/0307936 A1* | 9/2023 | Kato | B60L 58/18 |
| 2023/0311706 A1* | 10/2023 | Takao | H02J 7/0013 |
| | | | 307/10.1 |
| 2024/0079660 A1* | 3/2024 | Lee | G01R 31/396 |
| 2024/0248143 A1* | 7/2024 | Kawakami | H01M 10/4207 |
| 2024/0356355 A1* | 10/2024 | Choi | G01R 31/3648 |

FOREIGN PATENT DOCUMENTS

| | | | |
|---|---|---|---|
| JP | 2016-523503 A | 8/2016 | |
| JP | 2019-145231 A | 8/2019 | |
| JP | 2020-529820 A | 10/2020 | |
| KR | 10-2016-0083776 A | 7/2016 | |
| KR | 10-1651772 B1 | 8/2016 | |
| KR | 10-2019-0057757 A | 5/2019 | |
| KR | 10-2019-0093410 A | 8/2019 | |
| KR | 10-2020-0059966 A | 5/2020 | |
| KR | 10-2020-0107172 A | 9/2020 | |
| KR | 10-2020-0112248 A | 10/2020 | |
| KR | 10-2179679 B1 | 11/2020 | |
| WO | 2020/189998 A1 | 9/2020 | |

OTHER PUBLICATIONS

International Search Report (with partial translation) and Written Opinion dated Apr. 21, 2022, for corresponding International Patent Application No. PCT/KR2022/000593.

Office Action dated Dec. 25, 2023, issued in corresponding Japanese Patent Application No. 2022-577173. (Note: JP 2012-070609 A and 10-2020-0059966 A were previously cited).

* cited by examiner

FIG. 6

| MEASUREMENT ORDER | 1 | 2 | 3 | 4 | 5 | 6 | 7 | 8 | 9 | 10 | 11 | 12 |
|---|---|---|---|---|---|---|---|---|---|---|---|---|
| RACK POWER MEASUREMENT VALUE[kW] | 88 | 88 | 108 | 88 | 88 | 108 | 99 | 99 | 88 | 108 | 108 | 108 |
| RACK POWER LIMIT[kW] | 90 | 90 | 90 | 90 | 90 | 90 | 90 | 90 | 90 | 90 | 90 | 90 |

FIG. 7

| MEASUREMENT ORDER | | 1 | 2 | 3 | 4 | 5 | 6 | 7 | 8 | 9 | 10 | 11 | 12 |
|---|---|---|---|---|---|---|---|---|---|---|---|---|---|
| Rack2 | RACK POWER MEASUREMENT VALUE[kW] | 88 | 88 | 88 | 108 | 88 | 88 | 99 | 88 | 88 | 88 | 88 | 88 |
| | RACK POWER LIMIT[kW] | 90 | 90 | 90 | 90 | 90 | 90 | 90 | 90 | 90 | 90 | 90 | 90 |
| Rack5 | RACK POWER MEASUREMENT VALUE[kW] | 88 | 88 | 88 | 99 | 99 | 108 | 88 | 99 | 99 | 108 | 108 | 88 |
| | RACK POWER LIMIT[kW] | 90 | 90 | 90 | 90 | 90 | 90 | 90 | 90 | 90 | 90 | 90 | 90 |
| Rack8 | RACK POWER MEASUREMENT VALUE[kW] | 88 | 88 | 108 | 99 | 88 | 88 | 88 | 88 | 108 | 108 | 108 | 108 |
| | RACK POWER LIMIT[kW] | 90 | 90 | 90 | 90 | 90 | 90 | 90 | 90 | 90 | 90 | 90 | 90 |

BATTERY BANK POWER CONTROL APPARATUS AND METHOD

TECHNICAL FIELD

The present application claims priority to Korean Patent Application No. 10-2021-0004821 filed on Jan. 13, 2021 in the Republic of Korea, the disclosures of which are incorporated herein by reference.

The present disclosure relates to a technology for controlling the power of a battery, and more particularly, to a technology for controlling the power of a battery bank including a plurality of battery racks.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. Also, the lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

Recently, a second battery has been widely used for energy storage not only in small devices such as portable electronic devices, but also in medium and large devices. For these medium and large devices, a very large number of second batteries are included. In this case, for efficient operation, management or control for the large number of second batteries included in the medium or large device, the second batteries are often configured in a certain group type.

In particular, in an energy storage system called ESS, it is possible to configure one battery module including several second batteries, and a plurality of these battery modules may be provided and stacked on a rack frame to configure one battery rack. In addition, a plurality of such battery racks may be arranged to configure a battery bank. One or more battery banks may be included to constitute a battery container, a battery box, a battery system, and the like.

As such, a plurality of battery racks may be included in the battery bank. In general, in the initial construction stage of the battery bank, a plurality of battery racks with similar performance may be provided. However, as a difference is generated in the degradation rate or performance of the second batteries included in the battery rack while the battery bank is operated, the internal resistance of each battery rack may be changed. In addition, this internal resistance difference may cause a difference between the amount of power input to or output from each battery rack. Moreover, when some battery racks are replaced while the battery bank is in operation, or when different types of (heterogeneous) battery racks are used together in the battery bank, a difference may be generated in power amount between the battery racks.

FIG. 1 is a diagram schematically showing an example of a power amount for each of a plurality of battery racks 10 in a battery bank according to the prior art.

Referring to FIG. 1, a battery bank includes ten battery racks 10 (Rack 1, Rack 2, Rack 3, . . . , Rack 10), and each battery rack 10 has the same power limit of 90 kW. At this time, when the power value input to the entire battery bank is 900 kW, if there is no difference in internal resistance between the battery racks 10, 90 kW may be input to each of the ten battery racks 10. However, if the internal resistance of a specific battery rack, for example Rack 10 in FIG. 1, is low compared to other battery racks, a greater power may be input to Rack 10 compared to other battery racks. For example, as shown in FIG. 1, 108 kW may be input to Rack 10, and 88 kW may be input to other battery racks (Rack 1 to Rack 9), respectively.

At this time, in Rack 10, a situation where the input power amount is 108 kW that exceeds the limit value of 90 kW may occur. In addition, due to this situation, Rack 10 may be damaged and can no longer be used. Moreover, due to the damage of Rack 10, the performance and reliability of the entire battery bank may be deteriorated.

As such, even when a plurality of battery racks 10 included in the battery bank are connected in parallel to each other and the same voltage is applied thereto, the power amount of a specific battery rack may be excessively increased due to a difference in internal resistance between the battery racks 10 or the like. In particular, while the battery bank is in operation, some battery racks may need to be replaced due to malfunctions of a specific battery rack or differences in performance or degradation rate between battery racks. At this time, a battery rack that is newly replaced and incorporated into the battery bank may have a relatively low internal resistance compared to other battery racks. Therefore, more current may flow in the new battery rack than in the existing battery racks. At this time, if the power amount of a specific battery rack exceeds the power limit of the corresponding battery rack, the corresponding battery rack may be damaged to deteriorate the performance of the entire battery bank.

DISCLOSURE

Technical Problem

The present disclosure is designed to solve the problems of the related art, and therefore the present disclosure is directed to providing a power control apparatus and method, which may effectively prevent a specific battery rack from being damaged due to power imbalance between battery racks in a battery bank including a plurality of battery racks.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery bank power control apparatus, which controls a power of a battery bank having a plurality of battery racks, comprising: a power adjusting unit configured to adjust a magnitude of a bank power amount input to or output from all of the plurality of battery racks based on a preset bank power limit; a power measuring unit configured to measure a rack power amount for each of the plurality of battery racks; and a bank control unit configured to set the bank power limit based on the rack power measurement value of each battery rack measured by the power measuring unit.

Here, the bank control unit may be configured to compare the rack power measurement value of each battery rack with a rack power limit stored in advance to correspond to each battery rack and set the bank power limit according to the comparison result.

In addition, the bank control unit may be configured to select a battery rack of which the rack power measurement value exceeds the rack power limit and set the bank power limit by using the rack power measurement value of the selected battery rack and the rack power limit.

In addition, the bank control unit may be configured to calculate a ratio of the rack power limit to the rack power measurement value as a reduction coefficient and compute the bank power limit based on the calculated reduction coefficient.

In addition, the bank control unit may be configured to update the bank power limit by multiplying the calculated reduction coefficient by a bank power limit set previously.

In addition, the bank control unit may be configured to compute the bank power limit based on the reduction coefficient of a battery rack of which the rack power measurement value exceeds the rack power limit.

In addition, when there are a plurality of battery racks of which the rack power measurement value exceeds the rack power limit, the bank control unit may be configured to compute the bank power limit based on a reduction coefficient calculated to be lowest.

In addition, the bank control unit may be configured to count the number of times that the rack power measurement value exceeds the rack power limit, and to compute the bank power limit when the number of counting times is equal to or greater than a criterion accumulated number of times.

In addition, the bank control unit may be configured to determine whether or not to block the battery rack based on a reciprocal of the calculated reduction coefficient.

In addition, when the calculated reciprocal is equal to or greater than a reference value, the bank control unit may be configured to block the connection of the corresponding battery rack.

In another aspect of the present disclosure, there is also provided an energy storage system, comprising the battery bank power control apparatus according to the present disclosure.

In another aspect of the present disclosure, there is also provided a battery bank power control method, which controls a power of a battery bank having a plurality of battery racks, comprising: an inputting/outputting step of inputting a power to a battery bank or outputting a power from the battery bank based on a preset bank power limit; measuring a rack power amount for each of the plurality of battery racks during the inputting/outputting step; and changing the bank power limit based on the rack power measurement value of each battery rack measured in the measuring step.

Advantageous Effects

According to the present disclosure, the power amount may be appropriately controlled in a battery bank including a plurality of battery racks.

In particular, according to one embodiment of the present disclosure, even if power imbalance occurs between the plurality of battery racks in the process of charging or discharging the plurality of battery racks, it is possible to prevent an excessive power amount exceeding a limit value from flowing into or out of a specific battery rack Therefore, according to this embodiment of the present disclosure, it is possible to prevent a specific battery rack from being damaged while maintaining stable performance of the entire battery bank.

In particular, according to one embodiment of the present disclosure, it is possible to prevent an excessive power from flowing into or out of a specific battery rack in various situations where differences between racks may occur during the installation or operation of the battery bank, such as when there is a difference in degradation between the battery racks, when some battery racks are replaced, or when different types of racks are used together, or the like.

BRIEF DESCRIPTION OF DRAWINGS

The accompanying drawings illustrate preferred embodiments of the present disclosure and together with the foregoing disclosure, serve to provide further understanding of the technical features of the present disclosure, and thus, the present disclosure is not construed as being limited to the drawings.

FIG. 6 is a table comparatively showing a rack power measurement value of a specific battery rack measured by the battery bank power control apparatus according to an embodiment of the present disclosure and a rack power limit of the corresponding battery rack.

FIG. 7 is a table comparatively showing rack power measurement values of various battery racks measured by a battery bank power control apparatus according to another embodiment of the present disclosure and a rack power limit of the corresponding battery racks.

MODES OF PRACTICING THE DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings but should be interpreted based on the meanings and concepts corresponding to technical aspects of the present disclosure on the basis of the principle that the inventor is allowed to define terms appropriately for the best explanation.

Therefore, the descriptions proposed herein are just preferable examples for the purpose of illustrations only, not intended to limit the scope of the disclosure, so it should be understood that other equivalents and modifications could be made thereto without departing from the scope of the disclosure.

Figure 1:
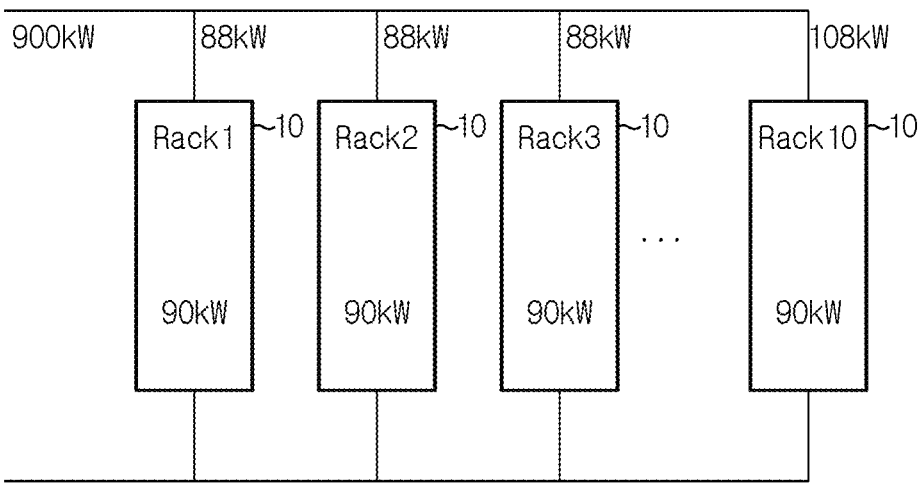
FIG. 1 is a diagram schematically showing an example of a power amount for each of a plurality of battery racks 10 in a battery bank according to the prior art.
Figure 2:
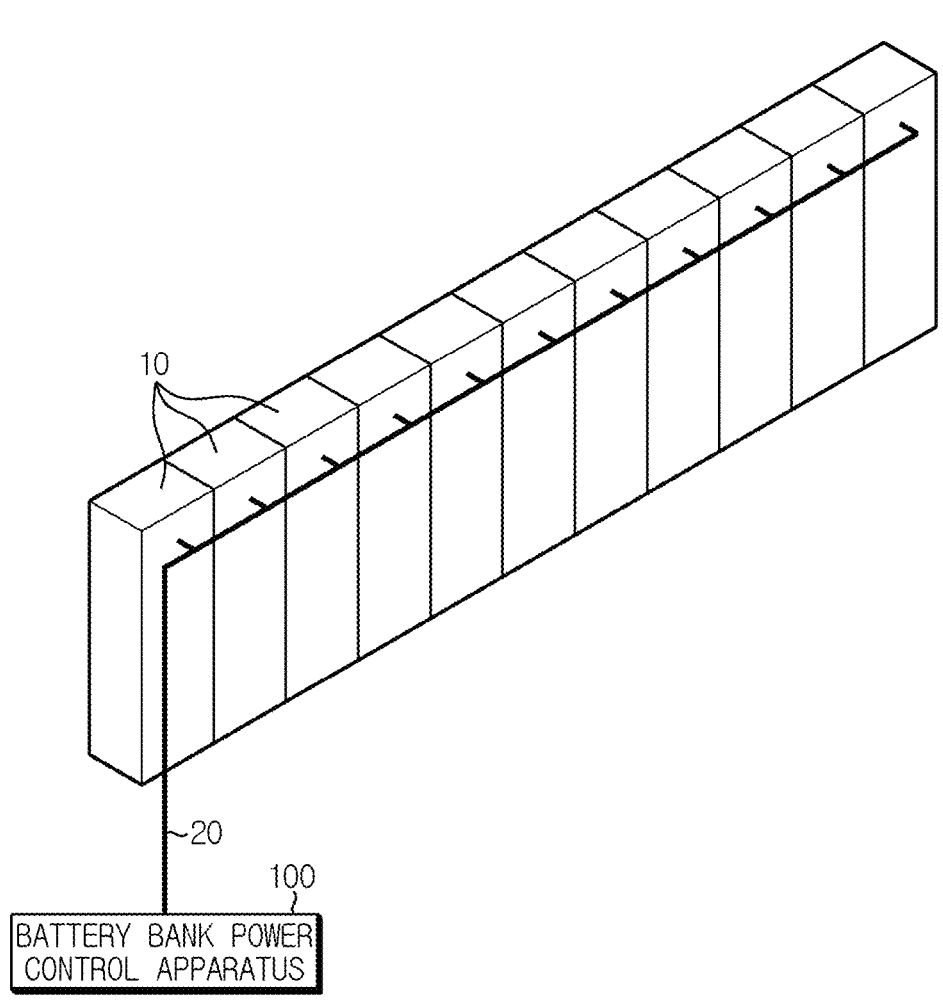
FIG. 2 is a diagram schematically showing a battery bank to which a battery bank power control apparatus according to an embodiment of the present disclosure is connected.
Figure 3:
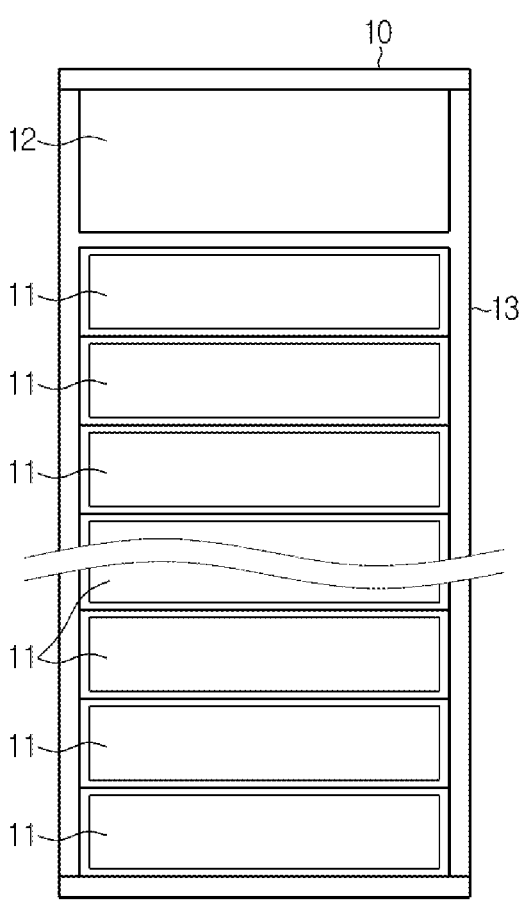
FIG. 3 is a diagram schematically showing an example of one battery rack included in the battery bank of FIG. 2.

FIG. 2 is a diagram schematically showing a battery bank to which a battery bank power control apparatus 100 according to an embodiment of the present disclosure is connected. FIG. 3 is a diagram schematically showing an example of one battery rack 10 included in the battery bank of FIG. 2.

First, referring to FIG. 2, the battery bank power control apparatus 100 according to the present disclosure may be connected to a battery bank and configured to control the power of the battery bank. In particular, the battery bank power control apparatus 100 may be connected to the battery bank through a cable 20. Here, the cable 20 may include a power cable provided to allow a charging/discharging power for the battery bank to flow, and a data cable provided to transmit/receive data or control signals to/from the battery bank.

Meanwhile, the battery bank may include a plurality of battery racks 10. In this case, the cable 20 may be configured to branch to each battery rack 10 at a predetermined point between the battery bank power control apparatus 100 and each battery rack 10. In addition, the plurality of battery racks 10 included in the battery bank may be electrically connected to each other in parallel.

Referring to FIG. 3, a plurality of battery modules 11 may be included in one battery rack 10. The plurality of battery modules 11 may be accommodated in a rack frame (or, a rack case) 13 and stacked in a vertical direction. However, the stacking configuration of the battery modules 11 is only an example, and the battery modules 11 may be stacked in various other forms. Meanwhile, in one battery module 11, a plurality of battery cells, namely a plurality of second batteries, may be included in a state of being electrically connected to each other in series and/or in parallel. In addition, the plurality of battery modules 11 may be electrically connected to each other in series and/or parallel to increase the output and/or capacity of the battery rack 10. In addition, the battery rack 10 may include a rack control unit 12 and be configured to control or measure various operations or states of the battery rack 10.

The configurations of the battery module 11, the battery rack 10 and the battery bank shown in FIG. 2 or 3 are merely examples, and the present disclosure is not necessarily limited to these configurations. In addition, the configurations of the battery module 11, the battery rack 10 and the battery bank are widely known at the time of filing of this application and thus will not be described in detail here.

Figure 4:
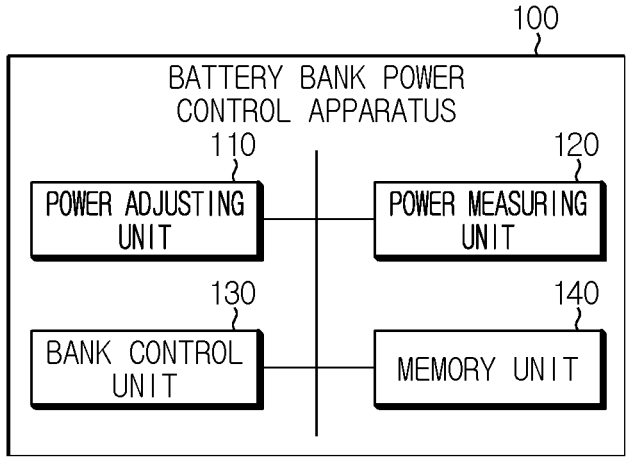
FIG. 4 is a block diagram schematically showing a functional configuration of the battery bank power control apparatus according to an embodiment of the present disclosure.

FIG. 4 is a block diagram schematically showing a functional configuration of the battery bank power control apparatus 100 according to an embodiment of the present disclosure. Also, FIG. 5 is a diagram schematically showing an example in which the battery bank power control apparatus 100 according to an embodiment of the present disclosure is connected to the battery bank.

Figure 5:
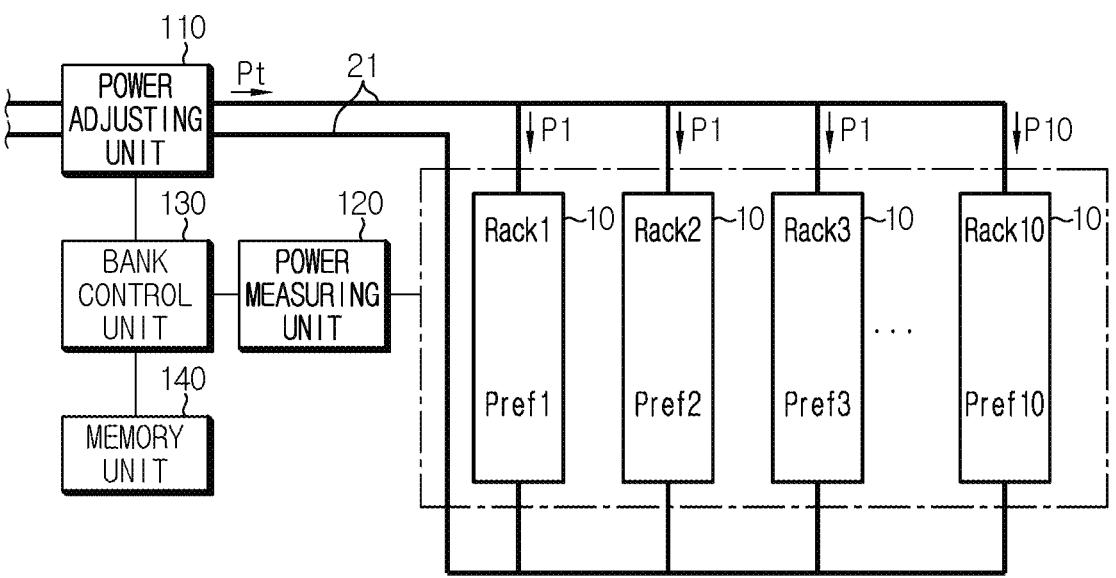
FIG. 5 is a diagram schematically showing an example in which the battery bank power control apparatus according to an embodiment of the present disclosure is connected to the battery bank.

Referring to FIGS. 4 and 5, the battery bank power control apparatus 100 according to the present disclosure may include a power adjusting unit 110, a power measuring unit 120, and a bank control unit 130.

The power adjusting unit 110 may be provided on a power supply path 21 between the battery bank and an external device. Here, the power supply path 21 may be included in the cable 20 shown in FIG. 2 above, but the present disclosure is not necessarily limited to this form. A power may be input or output to/from the battery bank through the power supply path 21. When a power is input to the battery bank through the power supply path 21, it may be regarded that the battery bank is charged. Conversely, when a power is output from the battery bank through the power supply path 21, it may be regarded that the battery bank is discharged.

Meanwhile, the external device connected to the battery bank is a device that may transmit and receive a power to/from the battery bank, and may be various charging devices or discharging devices. For example, the external device may be a power generation device or a power plant such as a solar power generator or a wind power generator, or a power system to which a commercial power is supplied. In addition, the external device may be a load requiring a power, such as each home, company, electric vehicle, or the like. The present disclosure is not limited by the specific type or form of an external device to which this battery bank is connected.

The power adjusting unit 110 may be configured to adjust the magnitude of a bank power amount. Here, the bank power amount may be referred to as a power amount input or output to/from all of the plurality of battery racks 10 included in the battery bank, as indicated by Pt in FIG. 5. That is, the bank power amount may be regarded as a power amount for the battery bank, rather than for each battery rack. For example, when ten battery racks 10 are included in the battery bank and the power flowing to each battery rack 10 is P1, P2, P3, . . . , P10 as shown in FIG. 5, the bank power amount Pt may be expressed as follows.

$$Pt = P1 + P2 + P3 + \ldots + P10$$

That is, the bank power amount may be regarded as a power amount that is the sum of the power amounts of every battery rack 10 included in the battery bank.

As a more specific example, when 100 kW of power is input to each battery bank, the bank power amount is 100 kW×10, which may be 1000 kW. In this case, the bank power amount of 1000 kW flows into the battery bank through a common path and may be distributed by approximately 100 kW through the branch path to flow into each battery rack 10.

As described above, the bank power amount may be referred to as the amount of power flowing in through a common path. The power adjusting unit 110 may adjust the magnitude of the power amount for the entire battery bank.

In particular, the battery bank may adjust the magnitude of the bank power amount based on a preset bank power limit. Here, the bank power limit may indicate an operating value of a charging/discharging power amount for the entire battery bank or a value indicating a maximum allowable value of the charging/discharging power amount for the entire battery bank.

First, the power adjusting unit 110 may allow the bank power amount to be operated according to the bank power limit. For example, when the bank power limit is 1000 kW, the power adjusting unit 110 may set the charging power or discharging power for the battery bank to 1000 kW.

Alternatively, the power adjusting unit 110 may allow the bank power amount to be operated so as not to exceed the bank power limit. For example, when the bank power limit is 1000 kW, the power adjusting unit 110 may set the charging/discharging power to 900 kW or 950 kW such that the charging power or discharging power for the battery bank does not exceed 1000 kW.

Meanwhile, the bank power limit required for the power adjusting unit 110 to adjust the magnitude of the bank power amount may be transmitted from other components such as the bank control unit 130 or stored in the power adjusting unit 110 itself.

The power adjusting unit 110 may include various components necessary to adjust the magnitude of the bank power amount, or may be implemented in various forms. In particular, the power adjusting unit 110 may be implemented as a power conversion device such as a PCS (Power Conversion System). Moreover, the component such as the PCS may be configured to enable AC-DC conversion for power. Accordingly, an AC power supplied from an external device may be converted into a DC power and input to the battery bank. Alternatively, the DC power output from the battery bank may be converted into an AC power and supplied to an external device by the PCS. In addition, the power adjusting unit 110 may be configured to connect or block the power supply path 21 to perform a switching operation for the power supply path 21.

The power adjusting unit 110 is a configuration capable of adjusting the magnitude of the power amount flowing into and out of the power supply path 21, and various power adjusting devices or components known at the time of filing of this application may be employed.

The power measuring unit 120 may be configured to measure a rack power amount. Here, the rack power amount may be referred to as a power amount flowing in and out of each of the plurality of battery racks 10 included in the battery bank.

For example, seeing the configuration shown in FIG. 5, when a bank power is supplied to the battery bank including ten battery racks 10, the supplied bank power may be distributed and introduced to each battery rack 10 Rack 1, Rack 2, Rack 3, . . . , Rack 10. In this case, the magnitude of the rack power amount flowing into each battery rack 10 may be P1, P2, P3, . . . , P10, respectively. The power measuring unit 120 may measure the magnitude P1, P2, P3, . . . , P10 of the rack power amount flowing into each battery rack 10 in this way.

Here, the power measuring unit 120 may be configured to directly measure the magnitude of the rack power amount flowing in each battery rack 10 and may be configured to receive information on the magnitude of the rack power amount from other components, for example each battery rack 10. For example, as shown in FIG. 3, when the rack control unit 12 is included in each battery rack 10, the rack control unit 12 may be configured to measure the magnitude of the rack power amount of the corresponding battery rack 10. In addition, the rack power amount information measured by the rack control unit 12 in this way may be transmitted to the power measuring unit 120. In this case, it may be regarded that the power measuring unit 120 measures the rack power amount indirectly.

The bank control unit 130 may be configured to set the bank power limit of the power adjusting unit 110. In this case, the bank control unit 130 may set the bank power limit based on the rack power measurement value of each battery rack 10 measured by the power measuring unit 120. Here, the bank control unit 130 may set the bank power limit by using rack power measurement values of at least some battery racks 10 among all battery racks 10.

For example, in the configuration of FIG. 5, the bank control unit 130 may be configured to set the bank power limit based on a rack power measurement value P3 for Rack 3. Then, according to the bank power limit set as described above, the power adjusting unit 110 may adjust the magnitude of the bank power amount Pt flowing into the battery bank.

According to this configuration of the present disclosure, the power amount of the entire battery bank may be adjusted based on the rack power measurement value of each battery rack 10 included in the battery bank. In addition, by adjusting the battery bank power amount as described above, it is possible to prevent an excessive power from flowing into or out of a specific battery rack 10. Accordingly, it is possible to effectively prevent a specific battery rack 10 from being damaged due to excessive use of the corresponding battery rack 10.

Moreover, the bank control unit 130 may be configured to compare the rack power measurement value with a rack power limit. Here, the rack power measurement value may be provided from the power measuring unit 120. That is, the bank control unit 130 may be electrically connected to the power measuring unit 120 to receive the rack power measurement value for each battery rack 10 from the power measuring unit 120.

In addition, the rack power limit for comparison with the rack power measurement value may be preset and stored in the bank control unit 130, or may be provided from another external component. In particular, the rack power limit may be stored separately for each battery rack 10. For example, as indicated by Pref1, Pref2, Pref3, . . . , Pref10 in FIG. 5, the rack power limit may be set to correspond to each battery rack 10, and such setting information may be provided to the bank control unit 130.

In addition, the bank control unit 130 may compare the rack power limit of each battery rack 10 and the rack power measurement value of each battery rack 10 transmitted from the power measuring unit 120 with each other. For example, the bank control unit 130 may compare the rack power measurement value P1 transmitted from the power measuring unit 120 with respect to Rack1 with a rack power limit Pref1 preset and stored for Rack1.

Here, the bank control unit 130 may be configured to compare the rack power measurement value and the rack power limit for all battery racks 10 included in the battery bank. For example, in FIG. 5, the bank control unit 130 may be configured to compare each rack power measurement value P1, P2, P3, . . . , P10 with rack power limit Pref1, Pref2, Pref3, . . . , Pref10, for all of Rack1, Rack2, Rack3, . . . , Rack10.

Alternatively, the bank control unit 130 may be configured to compare the rack power measurement value and the rack power limit for some battery racks 10 among all battery racks 10 included in the battery bank. For example, the bank control unit 130 may be configured to compare the rack power measurement value measured with the largest magnitude among all battery racks 10 with the rack power limit corresponding to the corresponding battery rack 10.

If the rack power measurement value and the rack power limit are compared as above, the bank control unit 130 may be configured to change the bank power limit of the power adjusting unit 110 according to the comparison result. For example, in the configuration of FIG. 5, the bank control unit 130 may be configured to set the bank power limit according to the comparison result of the rack power measurement value P3 for Rack 3 and the rack power limit Pref3. Then, according to the bank power limit set as described above, the power adjusting unit 110 may adjust the magnitude of the bank power amount Pt flowing into the battery bank.

According to this configuration of the present disclosure, the power amount of the entire battery bank may be adjusted based on the comparison result of the rack power measurement value of each battery rack 10 included in the battery bank and the rack power limit. In addition, by adjusting the battery bank power amount as described above, it is possible to prevent an excessive power from flowing into or out of a specific battery rack 10. Accordingly, it is possible to effectively prevent a specific battery rack 10 from being damaged due to excessive use of the corresponding battery rack 10.

Meanwhile, in the embodiment of FIG. 5 above, it is described that ten battery racks 10 are included in the battery bank, and the present disclosure has been described based thereon. However, the number of battery racks 10 is only an example, and battery racks 10 may be included in the battery bank in various other numbers.

In addition, although the former embodiment of FIG. 5 has been described based on the case where a power is supplied to the battery bank, namely the case where the battery bank is charged, the above contents may be similarly applied even to the case where the battery bank is discharged. Hereinafter, one of the cases of charging and discharging will be mainly described, and overlapping descriptions will be omitted as much as possible.

At least one of the bank control unit 130, the power measuring unit 120 and the power adjusting unit 110 may optionally include application-specific integrated circuits (ASIC), other chipsets, logic circuits, registers, communication modems, data processing devices, or the like, known in the art, or may be implemented as such components or devices, in order to execute various control logics performed in the present disclosure. In particular, when a control logic is implemented in software, at least one of the bank control unit 130, the power measuring unit 120 and the power adjusting unit 110 may be implemented as a set of program modules. In this case, the program module may be stored in a memory and executed by the processor. The memory may be provided inside or outside the processor, and may be connected to the processor through various well-known means. In addition, the battery bank often includes a control unit referred to by various terms such as a battery section controller (BSC) or an energy management system (EMS). In this case, the bank control unit 130, the power measuring unit 120 and/or the power adjusting unit 110 may be implemented entirely or at least partially by the control units provided in the conventional battery bank.

Meanwhile, in the present disclosure, when each component is implemented as a processor or the like, terms such as 'to be' or 'configured to be' for an operation or function of each component may be understood as meaning 'programmed to perform the corresponding operation or function'.

The battery bank power control apparatus 100 according to the present disclosure may further include a memory unit 140 as shown in FIGS. 4 and 5.

The memory unit 140 may store a program or data required for another component of the battery bank power control apparatus 100 according to the present disclosure, for example the bank control unit 130, the power measuring unit 120 or the power adjusting unit 110, to perform its function. For example, the memory unit 140 may store the rack power limit set for each battery rack 10. In addition, other components such as the bank control unit 130 may receive such data or programs by accessing the memory unit 140.

The memory unit 140 may adopt any information storage means known in the art to be capable of writing, erasing, updating and reading data, without limitation. As an example, the information storage means may include a RAM, a flash memory, a ROM, an EEPROM, a register, and the like. Also, the memory unit 140 may store program codes in which processes executable by other components such as the bank control unit 130 are defined.

The bank control unit 130 may be configured to select a battery rack 10 of which the rack power measurement value exceeds the rack power limit.

For example, seeing the configuration of FIG. 5, the bank control unit 130 may be configured to select a battery rack 10 of which the rack power measurement value P1, P2, P3, . . . P10 exceeds the rack power limit Pref1, Pref2, Pref3, . . . , Pref10, among ten racks 10 Rack1, Rack2, Rack3, . . . , Rack10 included in the battery bank.

As a more specific example, in the embodiment of FIG. 5, it is assumed that the rack power limits Pref1, Pref2, Pref3, . . . , Pref10 of all battery racks 10 are the same as 90 kW. At this time, when the rack power measurement values P1, P2, P3, . . . , P9 of Rack1, Rack2, Rack3, . . . , Rack9 are all 88 kW and only the rack power measurement value P10 of Rack10 is 108 kW, the bank control unit 130 may select Rack10 among ten battery racks 10 since only the rack power measurement value for Rack10 is greater than the rack power limit.

In addition, if a specific battery rack 10 is selected as described above, the bank control unit 130 may be configured to set the bank power limit by using the rack power measurement value of the selected battery rack 10 and the rack power limit.

For example, if Rack10 is selected as in this embodiment, the bank control unit 130 may set the bank power limit by using the rack power measurement value P10 of Rack10 and the rack power limit Pref10.

In addition, if the bank power limit is set in this way, the set bank power limit information may be provided to the power adjusting unit 110. Then, the power adjusting unit 110 may be configured to adjust the magnitude of the bank power amount Pt according to the set bank power limit. In particular, the power adjusting unit 110 may be configured such that the bank power amount Pt does not exceed the bank power limit set by the bank control unit 130.

Also, the bank control unit 130 may calculate a reduction coefficient by using the rack power measurement value of the battery rack 10 and the rack power limit. In particular, the reduction coefficient is a ratio of the rack power limit to the rack power measurement value and may be expressed as follows.

$$\text{Reduction coefficient} = (\text{rack power limit/rack power measurement value})$$

The reduction coefficient may be calculated for a specific battery rack 10.

In particular, the reduction coefficient may be calculated from the measurement value and the limit value of the battery rack 10 that is selected in the former embodiment so that the rack power measurement value exceeds the rack power limit.

For example, in the embodiment of FIG. 5, if Rack10 is selected, the reduction coefficient for the entire battery bank may be calculated as follows by using P10, which is the rack power measurement value of Rack10, and Pref10, which is the rack power limit of Rack10.

$$\text{Reduction coefficient} = Pref10/P10$$

As a more specific example, when the power measurement value P10 of Rack10 is 108 kW and the power limit Pref10 of Rack10 is 90 kW, the bank control unit 130 may calculate the reduction coefficient as follows.

$$\text{Reduction coefficient} = 90/108 \approx 0.83$$

In addition, if the reduction coefficient is calculated in this way, the bank control unit 130 may compute the bank power limit based on the calculated reduction coefficient.

For example, if the reduction coefficient is calculated as 0.83 as in this embodiment, the bank control unit 130 may compute the magnitude of the power flowing into the entire battery bank, namely the bank power limit, by using the reduction coefficient of 0.83.

Moreover, the bank control unit 130 may be configured to update the bank power limit by using the calculated reduction coefficient. That is, a power may already flow into and out of the battery bank according to a bank power limit set previously. In this case, if the bank power limit is updated by the bank control unit 130, the power amount of the battery bank may be changed according to the updated bank power limit.

In particular, the bank control unit 130 may be configured to update the bank power limit by multiplying the calculated reduction coefficient by the previously set bank power limit.

For example, when the calculated reduction coefficient is represented by DF, the previously set bank power limit is represented by Pb, and the newly updated bank power limit is represented by Pb', the bank power limit may be updated according to the following equation.

$$Pb'=Pb \times DF$$

As a more specific example, if the current bank power limit is set to 900 kW and the reduction coefficient DF is calculated as 0.83 as in this embodiment, the bank control unit 130 may update the bank power limit as follows.

$$Pb'=900 \times 0.83=747$$

That is, the bank control unit 130 may newly set the bank power limit from 900 kW to 747 kW.

In addition, the information on the newly set bank power limit as described above may be transmitted to the power adjusting unit 110. Then, the power adjusting unit 110 may limit the power amount of the battery bank according to the newly set bank power limit. For example, the power adjusting unit 110 may reduce the magnitude of the power amount flowing into or out of the battery bank from 900 kW to 747 kW.

In particular, the bank control unit 130 may be configured to compute the bank power limit based on the reduction coefficient of a battery rack 10 of which the rack power measurement value exceeds the rack power limit. That is, as described in the former embodiment, in the embodiment of FIG. 5, if the rack power measurement value P10 of Rack10 among ten battery racks 10 exceeds the rack power limit Pref10, the bank control unit 130 may compute the bank power limit for the entire battery bank based on the reduction coefficient of Rack10.

According to this embodiment of the present disclosure, even if a current flows in an unbalanced manner due to the difference in internal resistance between the battery racks 10, it is possible to effectively prevent a specific battery rack 10 from being damaged.

For example, in the embodiment of FIG. 5, if the rack power limit of each battery rack 10 is 90 kW for all battery racks, the bank power amount flowing into the entire battery bank may be set to 900 kW, which is 90 kW×10. However, if Rack10 is a rack newly installed to the battery bank or a heterogeneous rack in a different type from other battery racks 10 (Rack1 to Rack9) and has a lower internal resistance than other battery racks 10, a greater current may flow to Rack10 in comparison to Rack1 to Rack9. In addition, due to this, the charging power amount of Rack10 may be greater than that of other racks. For example, the power amount of each of Rack1 to Rack9 may be 88 kW, and only the power amount of Rack10 may be 108 kW. At this time, Rack10 is highly likely to be damaged when the power amount of 108 kW is introduced and Rack10 continues to be used. In addition, if a specific battery rack is damaged as above, the capacity of the entire battery bank will be reduced. Moreover, if an excessive power greater than the limit value flows into or out of Rack10, it may cause more serious problems such as ignition or explosion to Rack10.

However, according to this embodiment of the present disclosure, the bank control unit 130 may identify that the power measurement value (108 kW) of Rack10 is greater than the rack power limit (90 kW) and calculate the reduction coefficient (0.83) by using the power measurement value (108 kW) of Rack10 and the rack power limit (90 kW).

In addition, the bank control unit 130 may set the bank power limit of 747 kW by multiplying the reduction coefficient (0.83) by the existing bank power amount (900 kW). In addition, by the bank power limit set as above, the power adjusting unit 110 may adjust the bank power amount to 747 kW. At this time, since the difference in internal resistance between the battery racks 10 may be in a level similar to the previous one, a relatively large current may still flow into Rack10 compared to other battery racks 10. However, since the overall bank power amount is reduced, the power amount of Rack10 may also be reduced than before.

In particular, according to this embodiment, the power amount of Rack10 may also be lowered below the power limit Pref10 of Rack10. At this time, it may be estimated that the ratio of the power amount between the battery racks 10 will show a similar form to the previous one. Therefore, if the reduced power amount of Rack10 is P10', the following equation may be established.

$$900:108=747:P10'$$

Therefore, P10' may be calculated as follows.

$$P10'=(747 \times 108) \div 900=89.64 \text{ [kW]}$$

That is, due to the newly set bank power limit, it may be regarded that the power amount of Rack10 is reduced from 108 kW to 89.64 kW. In addition, this is less than 90 kW, which is the rack power limit of Rack10.

Therefore, according to this embodiment of the present disclosure, in a situation where a specific battery rack 10 among the plurality of battery racks 10 included in the battery bank is operated to exceed the rack power limit, the rack power amount of the corresponding battery rack 10 may be lowered below the rack power limit. Therefore, in this case, it is possible to fundamentally prevent the specific battery rack 10 from being damaged, ignited or exploded due to continuous use beyond the limit value.

Moreover, the battery bank power control apparatus 100 according to the present disclosure may frequently adjust the magnitude of the bank power amount by periodically or aperiodically updating the bank power limit according to the above-described process. In addition, according to the setting degree of the update period, the magnitude of the bank power amount may also be adjusted in real time. Therefore, even if the power amount of a specific battery rack 10 exceeds the limit value, it is possible to effectively prevent permanent damage or performance degradation of the battery rack 10 or the battery bank by quickly adjusting the power amount.

In addition, if a plurality of battery racks 10 of which the rack power measurement value exceeds the rack power limit are identified, the bank control unit 130 may be configured to compute the bank power limit based on the lowest reduction coefficient among the reduction coefficients for each of the identified battery racks 10.

For example, when three battery racks 10 of which the rack power measurement value exceeds the rack power limit are identified, the bank control unit 130 may calculate a reduction coefficient for each of the three battery racks 10. In addition, the bank control unit 130 may compute the bank power limit by using the lowest reduction coefficient among the calculated reduction coefficients.

As a more specific example, if it is identified that the rack power measurement value exceeds the rack power limit for Rack3, Rack7, and Rack9, the bank control unit 130 may calculate the reduction coefficient for each of three battery racks Rack3, Rack7, Rack9.

At this time, if the calculated reduction coefficient for Rack3 is 0.95, the calculated reduction coefficient for Rack7 is 0.81, and the calculated reduction coefficient for Rack9 is 0.89, the lowest reduction coefficient is 0.81 for Rack7. Accordingly, the bank control unit 130 may compute the bank power limit by using 0.81, which is the lowest reduction coefficient.

According to this configuration of the present disclosure, even if only a processing process based on one battery rack 10 is performed in a situation where the power amount equal to or greater than the limit value is input and output to/from the plurality of battery racks 10, the power amount may be set to be equal to or less than the limit value for all battery racks 10. Therefore, in this case, it may be possible to more efficiently control the power amount.

Also, the bank control unit 130 may be configured to count the number of times that the rack power measurement value exceeds the rack power limit for each battery rack 10. In addition, the bank control unit 130 may be configured to judge whether the number of times to count that the rack power measurement value exceeds the rack power limit (hereinafter, the number of counting times) in a specific battery rack 10 is greater than or equal to a criterion accumulated number of times. Here, the criterion accumulated number of times may be variously set and stored in advance according to various situations, such as the specifications of the battery bank or the battery rack 10, and the operating form or conditions of the battery bank. For example, the criterion accumulated number of times may be set to 5 and stored in the memory unit 140 or the like. In addition, the bank control unit 130 may be configured to compute the bank power limit when the comparison result, namely the number of counting times, is greater than or equal to the criterion accumulated number of times. This embodiment will be described in more detail with reference to FIG. 6.

FIG. 6 is a table comparatively showing a rack power measurement value of a specific battery rack 10 measured by the battery bank power control apparatus 100 according to an embodiment of the present disclosure and a rack power limit of the corresponding battery rack 10.

The result shown in FIG. 6 may be a measurement value for any one battery rack 10 among the plurality of battery racks 10 included in the battery bank and a limit value. For example, it may be regarded that the result of FIG. 6 shows the rack power measurement value for Rack10 among various battery racks 10 shown in FIG. 5 and a rack power limit.

In FIG. 6, for a specific battery rack 10, for example Rack10, a total of twelve rack power amounts are measured from the $1^{st}$ order to the $12^{th}$ order, and measurement values for each order are recorded. At this time, the limit value of the corresponding battery rack 10 is set to be the same as 90 kW in all measurement orders. Meanwhile, it is assumed that the criterion accumulated number of times is set to 5 times.

In this situation, if the rack power measurement value is identified as shown in FIG. 6, the bank control unit 130 may count the number of times that the rack power measurement value exceeds the rack power limit. That is, the case where the rack power measurement value exceeds the rack power limit may be regarded as $3^{rd}$, $6^{th}$, $7^{th}$, $8^{th}$, $10^{th}$, $11^{th}$ and $12^{th}$ measurement. Therefore, the number of times to count that the rack power measurement value exceeds the rack power limit is a total of 7 times, which exceeds 5 times that is the criterion accumulated number of times. Therefore, the bank control unit 130 may determine that it is necessary to adjust the bank power amount and set a new bank power limit.

In particular, the bank control unit 130 may be configured to compute the bank power limit and change the bank power amount at a time point that the number of counting times is equal to or greater than the criterion accumulated number of times.

For example, in the embodiment of FIG. 6, the time point that the number of counting times becomes equal to or greater than 5 times that is the criterion accumulated number of times may be the $10^{th}$ measurement.

Accordingly, the bank control unit 130 may be configured to compute the bank power limit at the time when the $10^{th}$ measurement is made, and to change the bank power amount through this.

In addition, the bank control unit 130 may be configured to compute the bank power limit by using the rack power measurement value at a time point when the number of counting times becomes equal to or greater than the criterion accumulated number of times.

For example, in the embodiment of FIG. 6, the time point at which the number of counting times becomes greater than or equal to the criterion accumulated number of times (5 times) is the $10^{th}$ measurement, and the rack power measurement value at this time is 108 kW. In this case, the bank control unit 130 may compute the bank power limit by using the measurement value of 108 kW. In addition, if the rack power limit is different for each order, the rack power limit may also be configured to use the limit value at the corresponding time point, namely at a time point that the number of counting times becomes equal to or greater than the criterion accumulated number of times.

According to this configuration of the present disclosure, even if the measurement values when the rack power measurement value exceeds the rack power limit are different from each other, it may be regarded that the standard by which the bank power limit is computed is clearly set. Therefore, the clarity about the computation of the bank power limit may be secured. Moreover, according to this embodiment, the rack power measurement value at a time point that the number of counting times is less than the criterion accumulated number of times need not be stored. For example, in the above embodiment, the measurement values from the $1^{st}$ to $4^{th}$ measurements do not need to be separately stored or managed. Therefore, in this case, it is possible to prevent the computation load of the bank control unit 130 or the storage capacity of the memory unit 140 from being unnecessarily increased.

In addition, the bank control unit 130 may be configured to compute the bank power limit when the number of times to consecutively count that the rack power measurement value exceeds the rack power limit (hereinafter, the number of consecutive counting times) is greater than or equal to a criterion consecutive number of times. At this time, the criterion consecutive number of times may be set differently from the criterion accumulated number of times. In particular, the criterion consecutive number of times may be set to a value smaller than the criterion accumulated number of times.

The criterion consecutive number of times may also be set in advance in consideration of various circumstances, such as the specifications of battery rack 10, the specifications of the battery bank, and the operating state or conditions of the battery bank. For example, the criterion consecutive number of times may be set to 3 times.

In addition, the bank control unit 130 may judge whether the number of consecutive counting times is greater than or equal to the criterion consecutive number of times. At this time, if the number of consecutive counting times is greater than or equal to the criterion consecutive number of times, the bank control unit 130 may be configured to judge that it is necessary to adjust the bank power amount, and compute the bank power limit.

For example, if the criterion consecutive number of times is set to 3, in the embodiment of FIG. 6, the time point that the rack power measurement value exceeds the rack power limit 3 or more times consecutively may be referred to as the $8^{th}$ measurement. That is, in FIG. 6, it may be regarded that the rack power measurement value exceeds the rack power limit three or more times consecutively in the $6^{th}$, $7^{th}$ and $8^{th}$ consecutive measurement orders. Therefore, the bank control unit 130 may compute the bank power limit at the $8^{th}$ measurement time point, and adjust the bank power amount thereby.

According to this configuration of the present disclosure, it is possible to quickly identify that the power amount of a specific battery rack 10 is maintained above the limit value, so that the problem situation may be more appropriately solved. That is, if the rack power measurement value continuously exceeds the rack power limit, the probability of a problem occurring in the battery rack 10 may increase, and in this embodiment, it is possible to detect such problem situations faster and take follow-up actions therefor.

Meanwhile, even though FIG. 6 is described based on the case where the rack power measurement value in one battery rack 10 exceeds the rack power limit, a situation where the rack power measurement value exceeds the rack power limit in a plurality of battery racks 10 may also occur. This will be described in more detail with reference to FIG. 7.

FIG. 7 is a table comparatively showing rack power measurement values of various battery racks 10 measured by a battery bank power control apparatus 100 according to another embodiment of the present disclosure and a rack power limit of the corresponding battery racks 10. This embodiment will be mainly described based on features different from the embodiment of FIG. 6, and features substantially identical to or similar to those of the embodiment of FIG. 6 will not be described in detail.

Referring to FIG. 7, rack power measurement values and rack power limits from the $1^{st}$ to $12^{th}$ measurements are described for three battery racks 10 Rack2, Rack5, Rack8. At this time, it is assumed that the rack power limit of all battery racks 10 is the same as 90 kW, and the criterion accumulated number of times is set to 5.

The bank control unit 130 may judge that the number of times that the rack power measurement value exceeds the rack power limit is counted as 5 times, which is the criterion accumulated number of times, or more, for Rack5 and Rack8 among three battery racks 10. In particular, the bank control unit 130 may identify a battery rack 10 of which the number of counting times (the number of times to count that the rack power measurement value exceeds the rack power limit) reaches the criterion accumulated number of times (5 times) first. In the embodiment of FIG. 7, it may be regarded that, in the case of Rack5, the number of counting times reaches the criterion accumulated number of times at the $9^{th}$ measurement time point, and in the case of rack8, the number of counting times reaches the criterion accumulated number of times at the $10^{th}$ measurement time point. Accordingly, the bank control unit 130 may compute the bank power limit based on the rack power limit of Rack5, of which the number of counting times reaches the criterion accumulated number of times first. That is, the bank control unit 130 may compute the bank power limit based on 99 kW, which is the $9^{th}$ measurement value of Rack5.

Meanwhile, if the rack power limit is different for each battery rack 10, the rack power limit used when computing the bank power limit may use the rack power limit of the battery rack 10 of which the rack power measurement value is selected, for example Rack5 in this embodiment.

In addition, the bank control unit 130 may be configured to determine whether or not to block the battery rack 10 based on the reduction coefficient. That is, as described above, the reduction coefficient may be calculated using the rack power limit and the rack power measurement value, and the bank control unit 130 may control whether or not to block the battery rack 10 in the battery bank by using the reduction coefficient.

In particular, the bank control unit 130 may determine whether or not to block the battery rack 10 based on the reciprocal of the reduction coefficient. Here, if the reduction coefficient is DF, the reciprocal of the reduction coefficient may be expressed as follows.

$$1/DF = (\text{rack power measurement value}/\text{rack power limit})$$

In addition, as a value to be compared with the reciprocal (1/DF) of the reduction coefficient, a reference value may be preset. Such a reference value may be determined as an appropriate value according to various environments or conditions, such as specifications of the battery rack 10 or the battery bank, or an operating state, and stored in advance in the memory unit 140 or the like.

At this time, the bank control unit 130 may judge whether the calculated reciprocal (1/DF) is greater than or equal to the reference value. In addition, when the calculated reciprocal (1/DF) for a specific battery rack 10 is judged to be greater than or equal to the reference value, the bank control unit 130 may block the connection to the corresponding battery rack 10 in the battery bank.

For example, in a state where the reference value is set to 1.3, if the calculated reciprocal for a specific battery rack 10, for example Rack10, is 1.4, the bank control unit 130 may block the connection with other battery racks in the battery bank for the corresponding battery rack 10, namely Rack10. Meanwhile, if the calculated reciprocal for a specific battery rack 10, for example Rack5, is 1.2, since it is less than the reference value, the bank control unit 130 may not block the connection in the battery bank for the corresponding battery rack 10, namely Rack5, but maintain the connection.

According to this embodiment, if the charging/discharging power amount for a specific battery rack 10 greatly exceeds the limit value, the corresponding battery rack 10 may be eliminated from the battery bank and no longer used. In a state where the charging/discharging power amount greatly exceeds the limit value, large damage may occur even after a short period of use. Therefore, in this case, the corresponding battery rack 10 may be more reliably protected by immediately stopping the use of the corresponding battery rack 10.

Meanwhile, the method of blocking the connection to a specific battery rack 10 inside the battery bank may be implemented in various forms. For example, each battery rack 10 may include a rack control unit 12, and the rack control unit 12 may be configured to control to turn on/off the charging/discharging power flowing to each battery rack 10. In this case, the bank control unit 130 may transmit a control signal to the rack control unit 12 of the corresponding battery rack 10 to block the connection of the corresponding battery rack 10.

As another example, if a separate switching unit is provided on the charging/discharging power path for each battery rack 10, the bank control unit 130 may turn off the switching unit to block the connection of the corresponding battery rack 10.

When computing the bank power limit, the bank control unit 130 may be configured to give a weight according to the use time. In particular, the bank control unit 130 may allow such a weight to be applied to the reduction coefficient used when computing the bank power limit.

For example, the reduction coefficient may be calculated as follows.

$$\text{Reduction coefficient} = (\text{rack power limit/rack power measurement value}) \times w$$

Here, w is a weight used when calculating the reduction coefficient, and may be set and endowed differently depending on the usage time of the battery rack 10 or the battery bank.

In particular, the weight w may be set gradually lower as the usage time of the battery rack 10 increases, for example as the number of cycles increases.

For example, the weight w may be set to w1 under a certain cycle, and set to w2, which is a lower value than w1, after the certain cycle. As a more specific example, the weight w may be set to 1 for 500 cycles or less, and set to 0.9 for more than 500 cycles.

Moreover, the number of cycles may be divided into three or more sections, and the weight w may be set differently for each section. For example, the weight w may be set to 1 in the section of 1 cycle to 500 cycles, set to 0.9 in the section of 501 cycles to 1000 cycles, and set to 0.8 in the section of 1001 cycles or more.

In this case, the reduction coefficient may gradually decrease as the cycle progresses. For example, in each of 100 cycle point, 600 cycle point and 1100 cycle point, even if (rack power limit/rack power measurement value) is calculated equally as 0.8, the weight may be differently endowed to 1, 0.9, and 0.8, respectively.

In this case, the reduction coefficient may be computed differently for each cycle as follows.

$$\text{Reduction coefficient in 100 cycle point:}$$
$$DF100 = 0.8 \times 1 = 0.8$$

$$\text{Reduction coefficient in 600 cycle point:}$$
$$DF600 = 0.8 \times 0.9 = 0.72$$

$$\text{Reduction coefficient in 1100 cycle point:}$$
$$DF1100 = 0.8 \times 0.8 = 0.64$$

That is, even if (rack power limit/rack power measurement value) are all the same, the reduction coefficient may be computed differently for each cycle. In particular, as the number of cycles of the corresponding battery rack 10 increases, the reduction coefficient may gradually decrease.

As the battery rack 10 is used, the second battery inside the battery rack 10 may be gradually degraded. Therefore, even if the rack power limit officially set for the battery rack 10 is kept constant, the limit value of the power amount allowed for the battery rack 10 may be actually lowered gradually. According to this embodiment, by changing the weight, it is possible to reflect the actual degradation situation of the battery rack 10. Therefore, in this case, the battery rack 10 may be protected more effectively.

The battery bank power control apparatus according to the present disclosure as described above may be included in a battery bank. In this case, the battery bank according to the present disclosure may include the battery bank power control apparatus according to the present disclosure together with a plurality of battery racks 10 and a cable 20.

In addition, the battery bank power control apparatus according to the present disclosure may be applied to an energy storage system ESS. That is, the energy storage system ESS according to the present disclosure may include the battery bank power control apparatus 100 according to the present disclosure as described above. In addition, the energy storage system according to the present disclosure may further include various components of the ESS known at the time of filing of this application, in addition to the battery bank power control apparatus 100 according to the present disclosure. Also, the energy storage system according to the present disclosure may include one or more battery banks. In particular, when a plurality of battery banks are included, the energy storage system may separately include the battery bank power control apparatus 100 corresponding to each battery bank.

Figure 8:
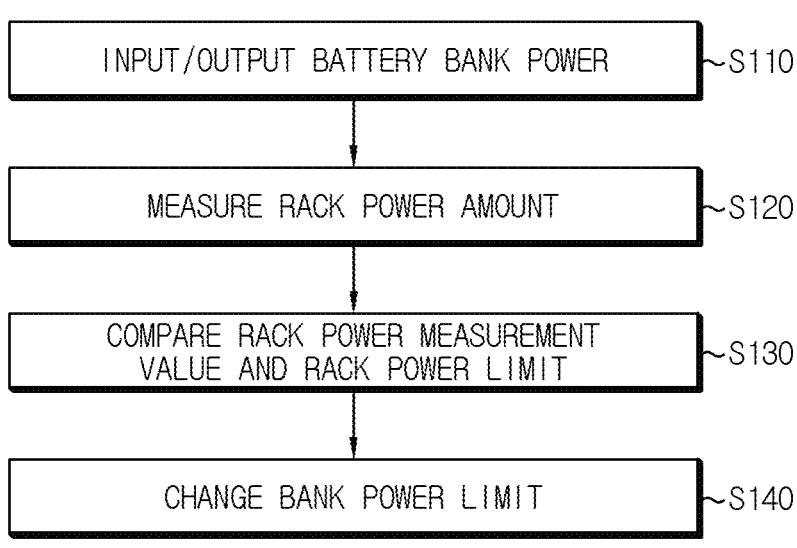
FIG. 8 is a flowchart for schematically illustrating a battery bank power control method according to an embodiment of the present disclosure.

FIG. 8 is a flowchart for schematically illustrating a battery bank power control method according to an embodiment of the present disclosure. In FIG. 8, the subject performing each step may be referred to as each component of the battery bank power control apparatus 100 described above.

As shown in FIG. 8, as a method of controlling a power of a battery bank having a plurality of battery racks, in particular a plurality of battery racks connected in parallel to each other, the battery bank power control method according to the present disclosure includes a bank power inputting/outputting step (S110), a rack power amount measuring step (S120) and a bank power limit changing step (S140).

First, in Step S110, based on a preset bank power limit, a power may be input to a battery bank or a power may be output from the battery bank.

Also, in Step S120, a rack power amount for each of the plurality of battery racks may be measured during Step S110.

Next, in Step S140, the bank power limit may be changed based on the rack power measurement value of each battery rack measured in Step S120.

Furthermore, as shown in FIG. 8, the battery bank power control method according to the present disclosure may further include a step of comparing the rack power measurement value of each battery rack measured in Step S120 with a rack power limit stored in advance to correspond to each battery rack.

In this case, in Step S140, the bank power limit may be set and changed according to the comparison result of Step S130.

In the battery bank power control method according to the present disclosure, various contents described above in relation to the battery bank power control apparatus 100 may be applied identically or similarly. Therefore, such contents will not be described in detail.

Meanwhile, in this specification, a technology of controlling a power based on a battery bank having a plurality of battery racks has been described, but this technology may also be applied to various types of battery systems including a plurality of battery groups, just with changed terms.

For example, the present disclosure may also be applied to a battery pack including a plurality of battery modules 11. In this case, in this specification, the description for the battery rack may be replaced with the description for the battery module 11, and the description for the battery bank may be replaced with the description for the battery pack. In addition, in this aspect of the present disclosure, the term "battery bank power control apparatus" may be replaced with the term "battery pack power control apparatus," and the term "bank control unit 130" may be replaced with the term "pack control unit."

Also, the present disclosure may be applied to an energy storage system having a plurality of battery banks. In this case, in this specification, the description for the battery rack may be replaced with the description for the battery bank, and the description for the battery bank may be replaced with the description for the energy storage system. In this case, the technology according to the present disclosure may be referred to as an energy storage system power control apparatus, and the term such as "bank control unit" may be replaced with a term such as "system control unit."

Meanwhile, in this specification, the term "~unit" is used for predetermined components, such as the "power adjusting unit," the "power measuring unit," the "bank control unit," and the like. However, it may be understood that these components are not necessarily physically separated elements but functionally distinct elements. For example, each component may be selectively integrated with other components, or each component may be divided into sub-components for efficient execution of control logic(s). In addition, it is apparent to those skilled in the art that even if components are integrated or divided, if the same function can be recognized, it should be interpreted that the integrated or divided components are also within the scope of this application.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

DESCRIPTION OF REFERENCE SIGNS

10: battery rack
11: battery module, 12: rack control unit, 13: rack frame
20: cable
21: power supply path
100: battery bank power control apparatus
110: power adjusting unit, 120: power measuring unit, 130: bank control unit,
140: memory unit

What is claimed is:

1. A battery bank power control apparatus for controlling a power of a battery bank having a plurality of battery racks, the battery bank power control apparatus comprising:
a power adjuster configured to adjust a magnitude of a bank power amount input to or output from the plurality of battery racks in the battery bank based on a preset bank power limit;
a power measurer configured to determine a rack power measurement value for each of the plurality of battery racks; and
a bank controller configured to:
compare the rack power measurement value of each respective battery rack among the plurality of battery racks with a rack power limit stored in advance to correspond to the respective battery rack,
calculate a ratio of the rack power limit corresponding to one of the plurality of battery racks to the rack power measurement value of the one of the plurality of battery racks as a reduction coefficient, and
update the bank power limit based on the calculated reduction coefficient.

2. The battery bank power control apparatus according to claim 1, wherein the bank controller is further configured to:
select a battery rack with the rack power measurement value exceeding the corresponding rack power limit, among the plurality of battery racks, as the one of the plurality of battery racks.

3. The battery bank power control apparatus according to claim 1, wherein the bank controller is further configured to update the bank power limit by multiplying the calculated reduction coefficient by the preset bank power limit.

4. An energy storage system, comprising the battery bank power control apparatus according to claim 1.

5. The battery bank power control apparatus according to claim 1, wherein the bank controller is further configured to determine whether or not to block the one of the plurality of battery racks based on a reciprocal of the calculated reduction coefficient.

6. The battery bank power control apparatus according to claim 5, wherein if the reciprocal of the calculated reduction coefficient is equal to or greater than a reference value, the bank controller is further configured to block a connection of the one of the plurality of battery racks with at least one other of the plurality of battery packs.

7. The battery bank power control apparatus according to claim 1, wherein the rack power measurement value of the one of the plurality of battery racks exceeds the corresponding rack power limit.

8. The battery bank power control apparatus according to claim 7, wherein, if more than one battery rack among the plurality of battery racks has the respective rack power measurement value exceeding the corresponding rack power limit, the bank controller is further configured to:
calculate a reduction coefficient of each of the battery racks having the respective rack power measurement value exceeding the corresponding rack power limit, and
update the bank power limit based on a lowest reduction coefficient among the calculated reduction coefficients of the battery racks having the respective rack power measurement value exceeding the corresponding rack power limit.

9. The battery bank power control apparatus according to claim 7, wherein the bank controller is further configured to:
count a number of times that the rack power measurement value of the one of the plurality of battery racks exceeds the corresponding rack power limit, and
update the bank power limit if the counted number is equal to or greater than a criterion accumulated number of times.

10. A battery bank power control method for controlling a power of a battery bank having a plurality of battery racks, the battery bank power control method comprising:

inputting a power to the battery bank or outputting a power from the battery bank based on a preset bank power limit;

measuring a rack power measurement value for each of the plurality of battery racks during the inputting or outputting of the power;

comparing the rack power measurement value of each respective battery rack, among the plurality of battery racks, with a rack power limit stored in advance to correspond to the respective battery rack;

calculating a ratio of the rack power limit corresponding to one of the plurality of battery racks to the rack power measurement value of the one of the plurality of battery racks as a reduction coefficient; and updating the bank power limit based on the calculated reduction coefficient.

11. The battery bank power control method of claim 10, wherein the updating of the bank power limit includes updating the bank power limit by multiplying the calculated reduction coefficient by the preset bank power limit.

12. The battery bank power control method of claim 10, further comprising:

determining whether or not to block the one of the plurality of battery racks based on a reciprocal of the calculated reduction coefficient.

13. The battery bank power control method of claim 12, further comprising:

if the reciprocal of the calculated reduction coefficient is equal to or greater than a reference value, blocking a connection of the one of the plurality of battery racks with at least one other of the plurality of battery packs.

14. The battery bank power control method of claim 10, further comprising:

selecting a battery rack with the respective rack power measurement value exceeding the corresponding rack power limit, among the plurality of battery racks, as the one of the plurality of battery racks.

15. The battery bank power control method of claim 14, wherein, if more than one battery rack among the plurality of battery racks has the respective rack power measurement value exceeding the corresponding rack power limit:

the calculating includes calculating a reduction coefficient for each of the battery racks having the respective rack power measurement value exceeding the corresponding rack power limit; and the updating of the bank power limit includes updating the bank power limit based on a lowest reduction coefficient among the calculated reduction coefficients of the battery racks having the respective rack power measurement value exceeding the corresponding rack power limit.

16. The battery bank power control method of claim 14, further comprising:

counting a number of times that the rack power measurement value of the one of the plurality of battery racks exceeds the corresponding rack power limit, wherein the updating includes updating the bank power limit if the counted number is equal to or greater than a criterion accumulated number of times.

\* \* \* \* \*